(12) United States Patent
Noujeim (10) Patent No.: US 7,764,141 B2
(45) Date of Patent: Jul. 27, 2010

(54) INTERLEAVED NON-LINEAR TRANSMISSION LINES FOR SIMULTANEOUS RISE AND FALL TIME COMPRESSION

(75) Inventor: Karam Michael Noujeim, Sunnyvale, CA (US)

(73) Assignee: Anritsu Company, Morgan Hill, CA (US)

( * ) Notice: Subject to any disclaimer, the term of this patent is extended or adjusted under 35 U.S.C. 154(b) by 122 days.

(21) Appl. No.: 11/860,396

(22) Filed: Sep. 24, 2007

(65) Prior Publication Data

US 2008/0246551 A1 Oct. 9, 2008

Related U.S. Application Data

(60) Provisional application No. 60/862,170, filed on Oct. 19, 2006.

(51) Int. Cl.
*H03K 5/06* (2006.01)
(52) U.S. Cl. ........................................................ 333/20
(58) Field of Classification Search .................. 333/20, 333/138, 139, 140, 156, 165
See application file for complete search history.

(56) References Cited

U.S. PATENT DOCUMENTS

| | | | |
|---|---|---|---|
| 5,014,018 A | 5/1991 | Rodwell et al. | 333/20 |
| 5,256,996 A | 10/1993 | Marsland et al. | 333/20 |
| 5,789,994 A | 8/1998 | Case et al. | 333/20 |
| 7,358,834 B1 * | 4/2008 | Pepper et al. | 333/208 |
| 2004/0227581 A1 * | 11/2004 | Noujeim | 333/20 |

OTHER PUBLICATIONS

Landauer, R., "Shock Waves in Nonlinear Transmission Lines and Their Effect on Parametric Amplification," IBM Journal of Research, Oct. 1960, pp. 391-401.
Hirota, R. and Suzuki, K., "Theoretical and Experimental Studies of Lattice Solitons in Nonlinear Lumped Networks," Proceedings of the IEEE, vol. 61, No. 10, Oct. 1973, pp. 1483-1491.
Case, M.G., "Nonlinear Transmission Lines for Picosecond Pulse, Impulse and Millimeter-Wave Harmonic Generation," Ph.D. Dissertation, Department of Electrical and Computer Engineering, University of California, Santa Barbara, California, U.S.A., Jul. 2, 1993, 205 pages.
Stake, J., "Planar Heterostructure Barrier Varactor Diodes for Millimetre Wave Applications," Ph.D. Thesis, Technical Report No. 360, Microwave Electronics Laboratory, Chalmers University of Technology, Göteborg, Sweden, Feb. 1999, 47 pages.

* cited by examiner

*Primary Examiner*—Robert Pascal
*Assistant Examiner*—Gerald Stevens
(74) *Attorney, Agent, or Firm*—Fliesler Meyer LLP (57) ABSTRACT

A non-linear waveguide comprises a transmission line including a first conductive line and a second conductive line; a first bias voltage supply connected with the transmission line; and one or more pairs of diodes connected between the first conductive line and the second conductive line, the one or more pairs of diodes including: a first diode having an anode connected with the first conductive line and a cathode connected with the second conductive line; a second diode having a cathode connected with the first conductive line and an anode connected with the second conductive line; and a second bias voltage supply connected between the anode of the second diode and the second conductive line.

18 Claims, 12 Drawing Sheets

INTERLEAVED NON-LINEAR TRANSMISSION LINES FOR SIMULTANEOUS RISE AND FALL TIME COMPRESSION

PRIORITY CLAIM

This application claims priority to the following U.S. Provisional Patent Application:

U.S. Provisional Patent Application No. 60/862,170, entitled "INTERLEAVED NON-LINEAR TRANSMISSION LINES FOR SIMULTANEOUS RISE AND FALL TIME COMPRESSION," filed Oct. 19, 2006.

TECHNICAL FIELD

The present invention relates generally to generation of microwave and millimeter wave signals, clock waveforms and delayed signals.

BACKGROUND OF THE INVENTION

Figure 1A:
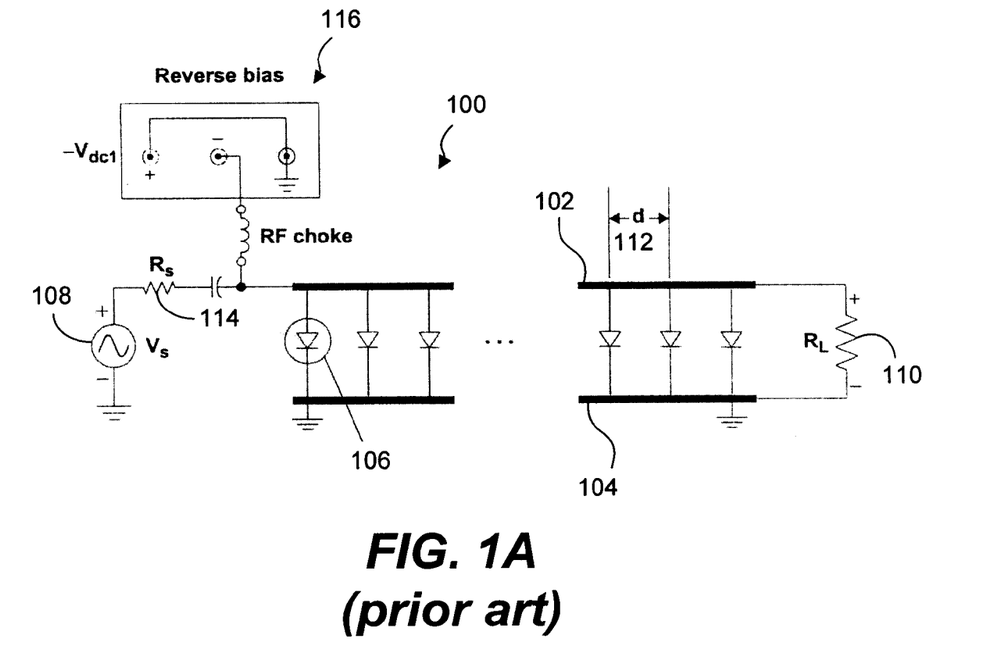
FIG. 1A is a circuit diagram of a periodic non-linear transmission line for fall-time compression in accordance with the prior art.
Figure 1B:
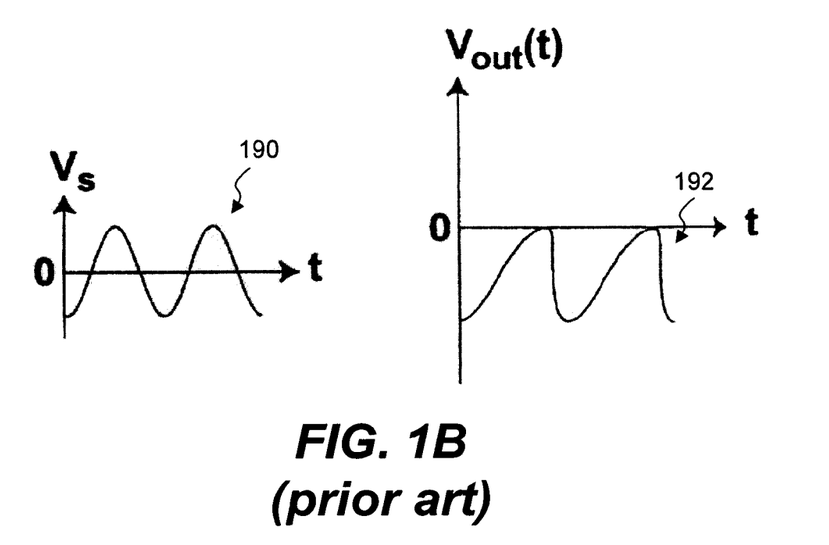
FIG. 1B is an exemplary plot of an input signal passed through the non-linear transmission line of FIG. 1A, and a resulting output signal.

Non-linear transmission lines support shock waves and electrical solitons, as has been known theoretically and demonstrated experimentally. FIG. 1A shows a periodic structure 100 made up of a non-linear waveguide comprising a transmission line consisting of a pair of conductors 102,104 loaded with varactor diodes 106 implementable in gallium arsenide (GaAs) technology and demonstrated to compress the fall time of a sinusoidal microwave signal. The varactor diodes 106 are separated by plurality of transmission line segments 112 of approximately equal line lengths or period d. A DC power supply 116 provides reverse bias to the varactor diodes 106. A signal generator 108, one node of which is grounded, supplies a generally sinusoidal input voltage signal 190 with a typical waveform as shown in FIG. 1B to the non-linear transmission line. The signal generator 108 has source impedance represented by a resistor 114. A load 110 is connected to receive a resultant output signal 192 shaped by the varactor-loaded transmission line, a typical waveform of which is shown in FIG. 1B.

Figure 2A:
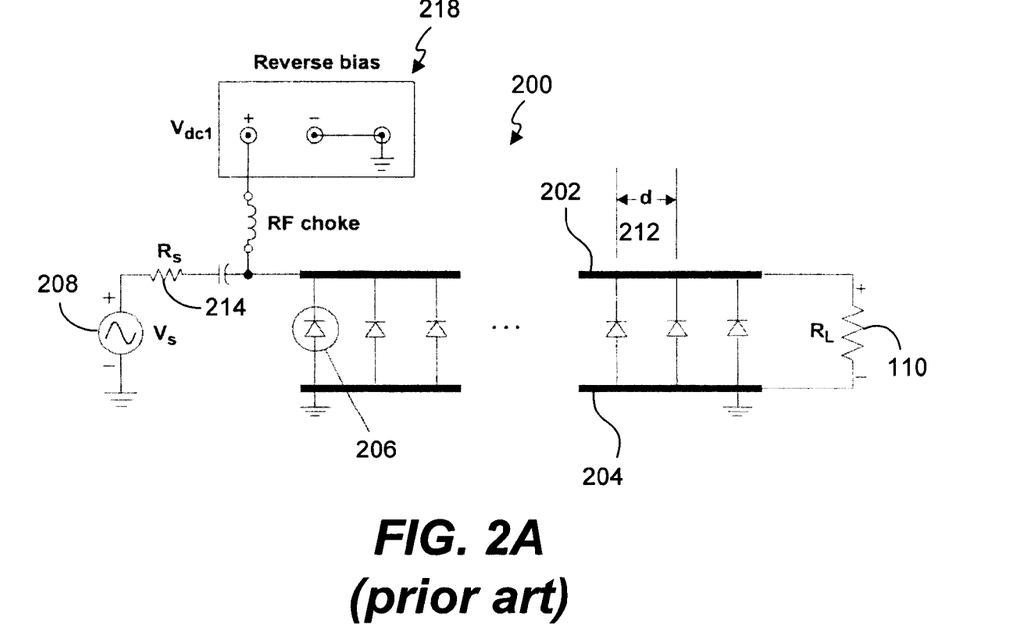
FIG. 2A is a circuit diagram of a periodic non-linear transmission line for rise time compression in accordance with the prior art.
Figure 2B:
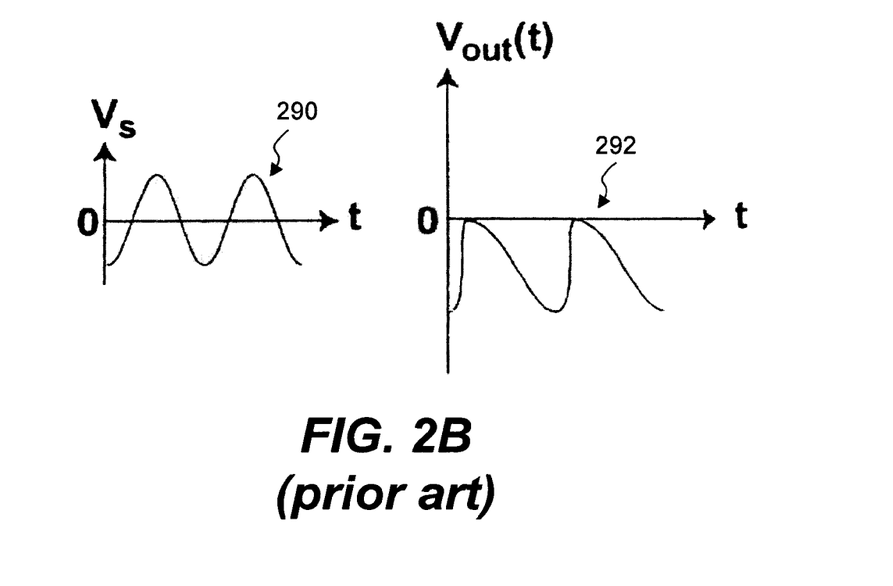
FIG. 2B is an exemplary plot of an input signal passed through the non-linear transmission line of FIG. 2A, and a resulting output signal.

FIG. 2A shows a periodic structure 200 made up of a non-linear waveguide comprising a transmission line consisting of a pair of conductors 202,204 loaded with varactor diodes 206 implemented in gallium arsenide (GaAs) technology and demonstrated to compress the rise time of a sinusoidal microwave signal. The varactor diodes 206 are separated by plurality of transmission line segments 212 of approximately equal line lengths or period d. A DC power supply 218 provides reverse bias to the varactor diodes 206. An input signal 290 and resultant output signal 292 are shown in FIG. 2B.

U.S. Pat. No. 5,789,994 to Case et al. teaches a non-linear waveguide employing a pair of transmission lines loaded with anti-parallel varactor diodes used to simultaneously compress the rise and fall times of a sinusoidal signal. The conversion efficiency of the circuit is lower than that of a purely reactive non-linear transmission line because the anti-parallel arrangement of one set of varactor diodes is reverse biased (reactive non-linearity) while the other set of varactor diodes is forward biased (resistive non-linearity).

In another approach, heterostructure barrier varactor diodes (HBV) having a symmetric C-V characteristic are used to generate odd-frequency harmonics (i.e. a square wave). However, self heating caused by the conduction current through the bulk of the varactor diodes results in reduced conversion efficiency. In addition, the unconventional epitaxy of HBV diodes can make their integration with other common processes (e.g. PHEMT, HBT) difficult.

BRIEF DESCRIPTION OF THE DRAWINGS

Further details of embodiments of the present invention are explained with the help of the attached drawings in which.

DETAILED DESCRIPTION

Figure 3A:
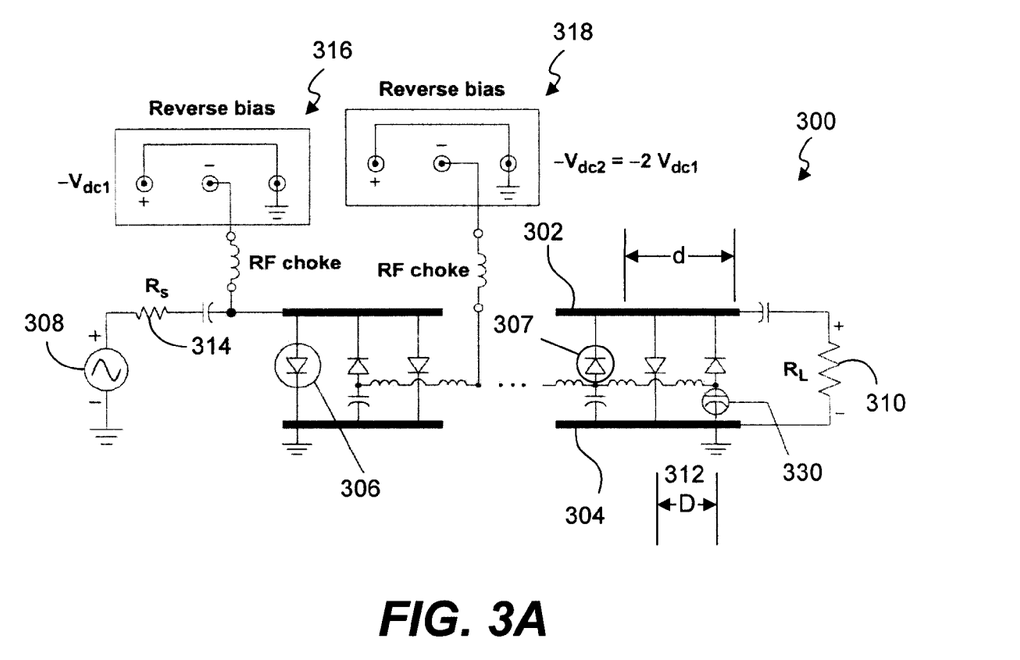
FIG. 3A is a circuit diagram of an embodiment of a periodic non-linear transmission line in accordance with the present invention for simultaneous rise and fall time compression.

Embodiments of nonlinear waveguides in accordance with the present invention can achieve simultaneous rise and fall time compression by interleaving a portion of a fall time compression circuit and a portion of a rise time compression circuit while providing a first reverse bias to rise compression varactor diodes 307 and a second reverse bias to fall compression varactor diodes 306 by way of two separate DC paths 316,318. The resulting interleaved structure is a reactive device that results in conversion efficiency improvements over typical non-linear waveguides. Referring to FIG. 3A, an embodiment of a non-linear waveguide in accordance with the present invention is shown comprising a transmission line including a pair of conductors 302,304 loaded with varactor diodes 306,307 arranged in an anti-parallel fashion. The varactor diodes 306,307 are separated by a plurality of transmission line segments 312 of approximately equal line lengths D. Non-linear transmission lines loaded periodically with varactor diodes at regular intervals d are said to be periodic.

Figure 3B:
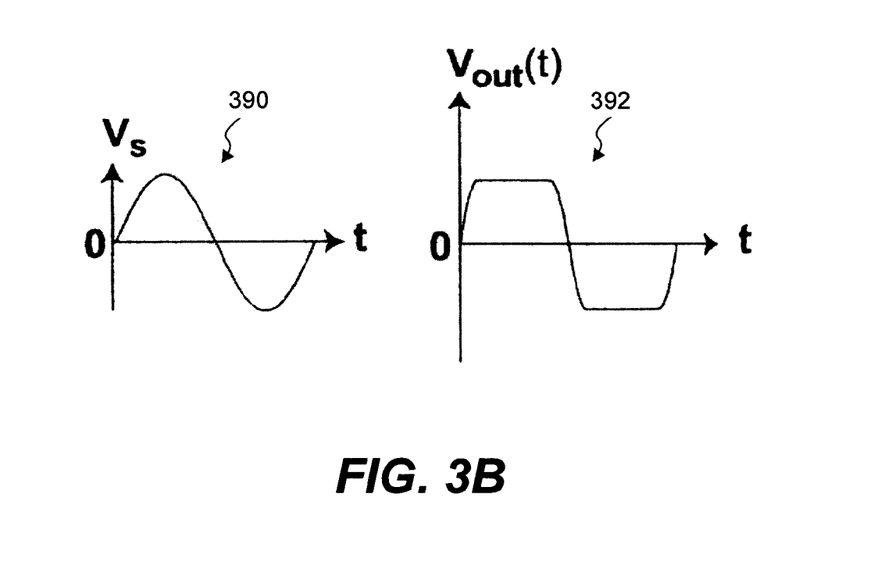
FIG. 3B is a plot of an input signal passed through the periodic non-linear transmission line of FIG. 3A, and a resulting output signal.

The cell length d defines the pitch or periodicity of the interleaved nonlinear transmission line. A signal generator 308, one node of which is grounded, supplies a signal to the interleaved non-linear transmission line. The signal generator 308 has source impedance represented by a resistor 314. A load 310 is connected to receive a resultant output signal. When driven by a large input signal 390, for example as shown in FIG. 3B, the non-linear waveguide compresses simultaneously the rise and fall times of the generally sinusoidal input signal 390 to produce an output signal such as shown in FIG. 3B. The amount of compression is dependent on the amplitude of the input signal, the number of varactor-diode sections and spacing between the varactor-diode sections, attenuation along the interleaved non-linear transmission line, and DC-bias values. Embodiments of waveguides in accordance with the present invention can enable one or more of (for example) conversion of a sinusoidal signal into a clock signal or equivalently into odd harmonics, simultaneous enhancement of the rise and fall times of a clock or data signal, and simultaneous variation of the rise and fall times of a signal by varying the signal's amplitude and the DC bias.

In other embodiments, the plurality of transmission line segments can be separated by non-equal line lengths. For example, high-frequency performance of a nonlinear transmission line can be improved upon by progressively decreasing the pitch between varactor diodes from the input to the output, thereby increasing the output Bragg frequency (also referred to herein as cutoff frequency, $F_c$) of the periodic structure or circuit as taught in U.S. Pat. No. 5,014,018. However, decreasing spacing between varactor diodes changes the large-signal characteristic impedance of the non-linear transmission line and must be compensated for by scaling the varactor-diode capacitance. The large-signal characteristic impedance is preferably constrained to approximately 50 ohms in a preferred embodiment (although in other embodiments in accordance with the present invention different characteristic impedances can be used to suit specific applications). In such a case, the cutoff frequency is limited mainly by spacing between adjacent varactor diodes and by lithographic constraints on the minimum junction area for the varactor. Adjacent varactor diodes are spaced far enough apart so as to result in low electromagnetic coupling between them. Non-linear transmission lines having transmission line segments of varying length can be said to be non-periodic.

In still other embodiments, the cutoff frequency of the nonlinear transmission line or waveguide can increase in blocks of sections. Thus, each block can contain a plurality of varactors. In the first block, the varactor diodes will have a first junction area and a first spacing. In the second block, the junctions will all be the same size but smaller than the size of junctions in the first section. Further, the spacing between the varactor diodes in the second section will be closer in proportion to the decrease in the junction area so as to maintain the characteristic impedance of that section at approximately 50 ohms. This pattern of ever-decreasing junction area and spacing between the varactor diodes in each block can be repeated, for example, until an appropriate length for the transmission line is achieved that results in a required electrical performance.

When driven by a small input signal, the non-linear waveguide can be used in an embodiment as a variable-delay line or phase shifter having a broad instantaneous bandwidth. Instantaneously broadband variable-delay lines can be used in myriad different circuits, for example as phase detectors for clock and data recovery, broadband wireless communications, phased arrays, etc.

Figure 4A:
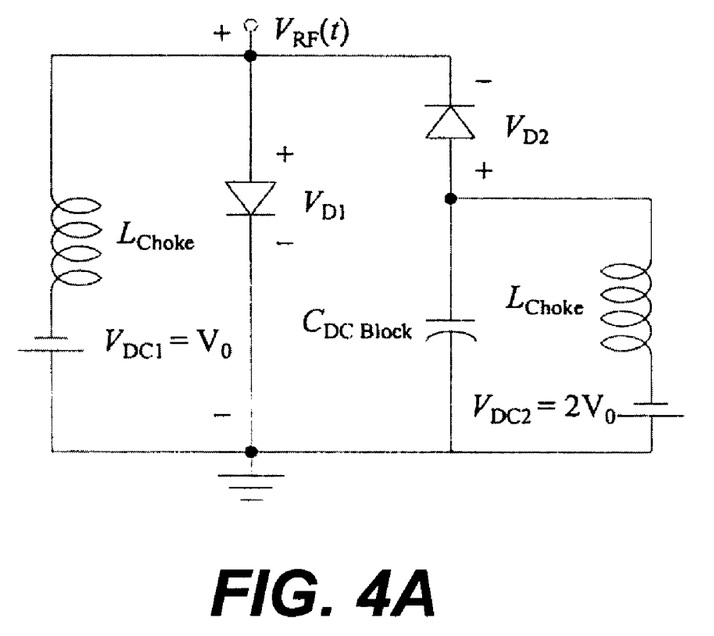
FIG. 4A is a simplified circuit diagram of a portion of an embodiment of a non-linear transmission line as shown in FIG. 3A.
Figure 4B:
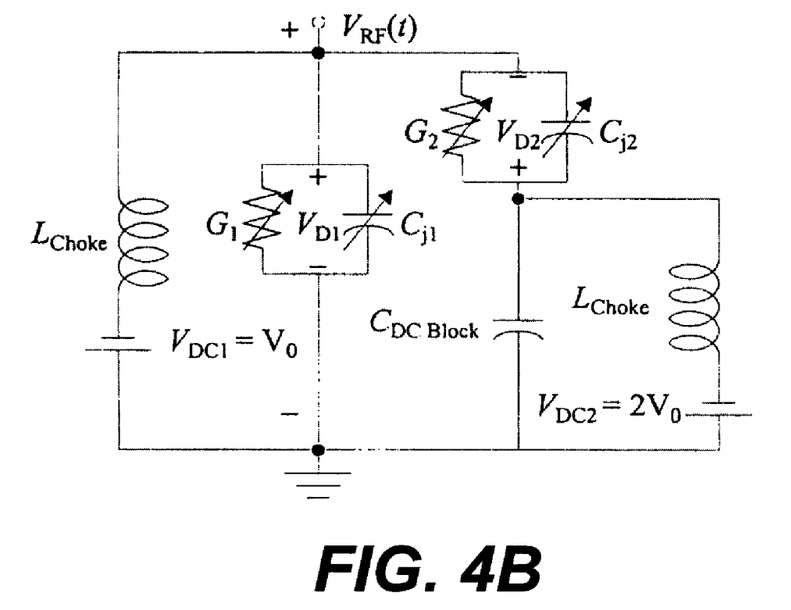
FIG. 4B is the simplified circuit diagram of FIG. 4A expressed using alternative structures.

FIG. 4A illustrates a simplified circuit diagram of a portion of an embodiment of a non-linear transmission line as shown in FIG. 3A for compressing the fall time and the rise time of a sinusoidal signal. The circuit of FIG. 4A can be expressed as shown in FIG. 4B, wherein the diode is expressed by way of relationships based on equations (1)-(3):

$$C_j(V) = \frac{C_{j0}}{\left(1 - \frac{V}{\phi}\right)^m} \quad (1)$$

$$i = i_s(e^{\alpha V} - 1) \quad (2)$$

$$G(V) = \frac{di}{dV} = \alpha(i - i_s) \quad (3)$$

Figure 5:
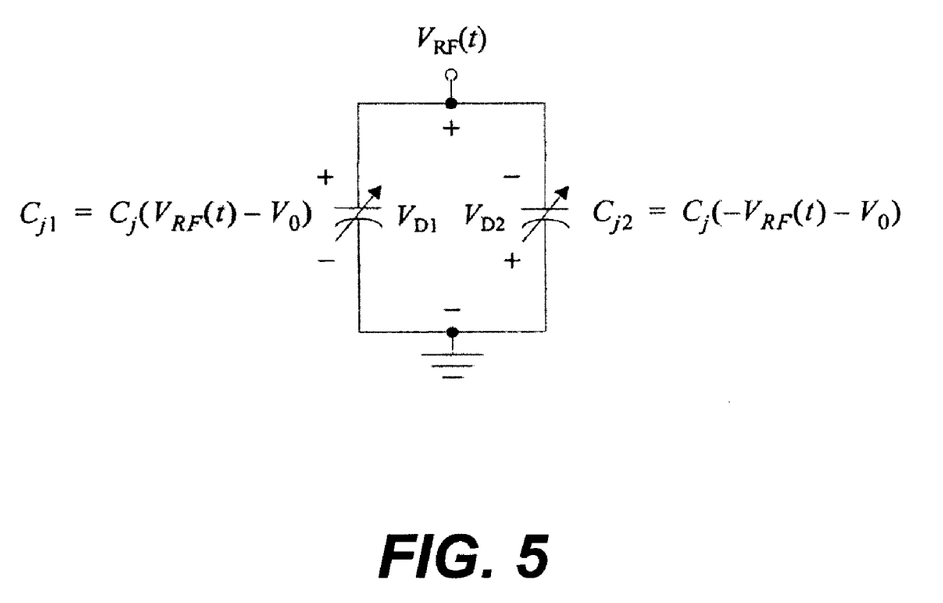
FIG. 5 is an equivalent circuit expressing at least a portion of the circuit of FIG. 4B.

An equivalent circuit for the circuit of FIG. 4B is illustrated in FIG. 5, and is derived by way of equations (4)-(7), below.

$$C_{j1} = C_j(V_{D1}) = C_j(V_{RF}(t) - V_{DC1}) = C_j(V_{RF}(t) - V_0) \quad (4)$$

$$C_{j2} = C_j(V_{D2}) = C_j(-V_{RF}(t) + (-V_{DC2} + V_{DC1})) = C_j(-V_{RF}(t) - V_0) \quad (5)$$

$$-V_0 < V_{RF}(t) < V_0 < V_{BR} \Rightarrow i \rightarrow i_s \Rightarrow G(V) \rightarrow 0 \quad (6)$$

$$C_{eq} = C_{j1} + C_{j2} = C_j(V_{RF}(t) - V_0) + C_j(-V_{RF}(t) - V_0) \quad (7)$$

Figure 6A:
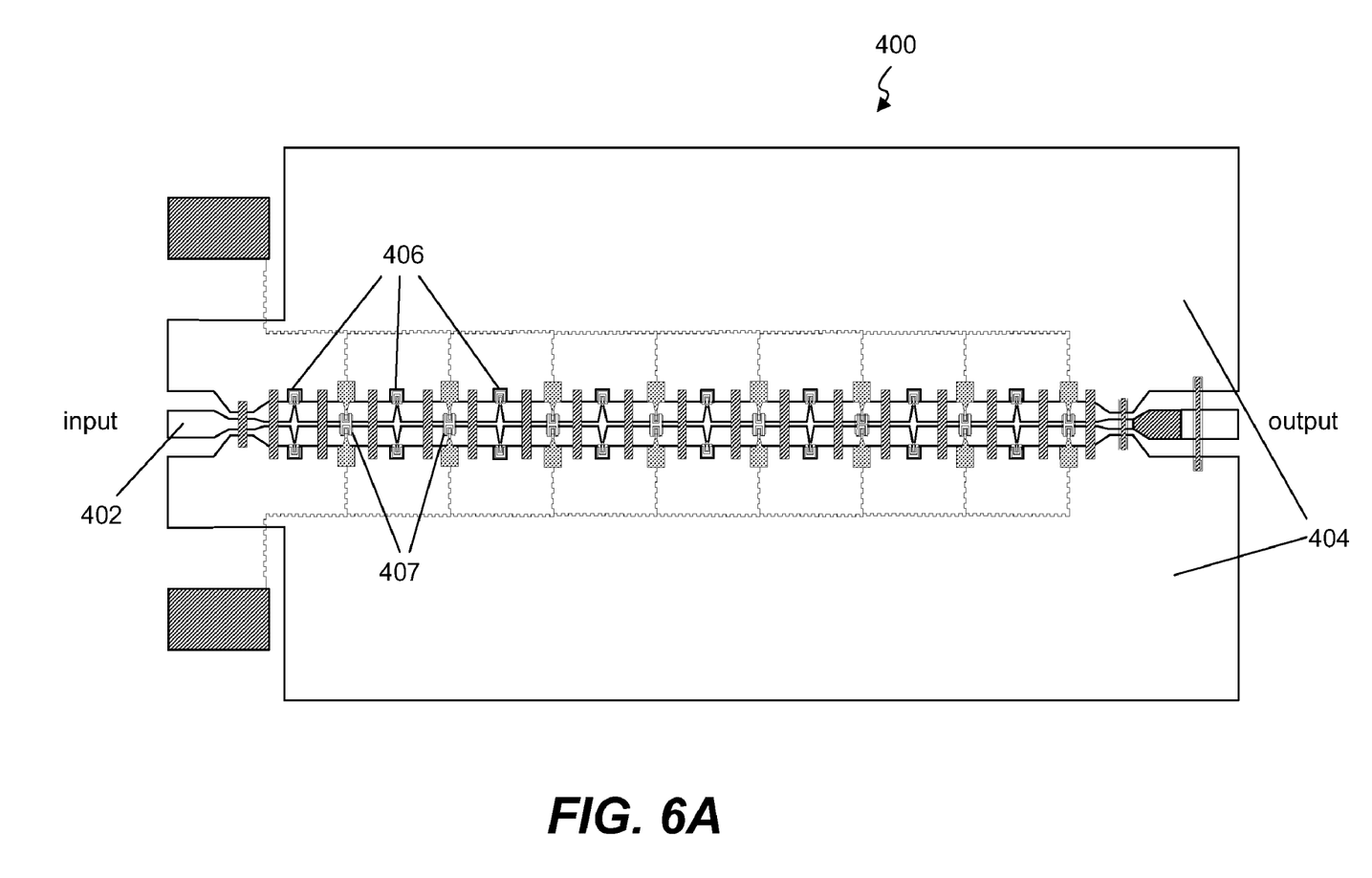
FIG. 6A is an embodiment of a co-planar-waveguide chip layout in accordance with the present invention for defining the non-linear transmission line of FIG. 3A.
Figure 6B:
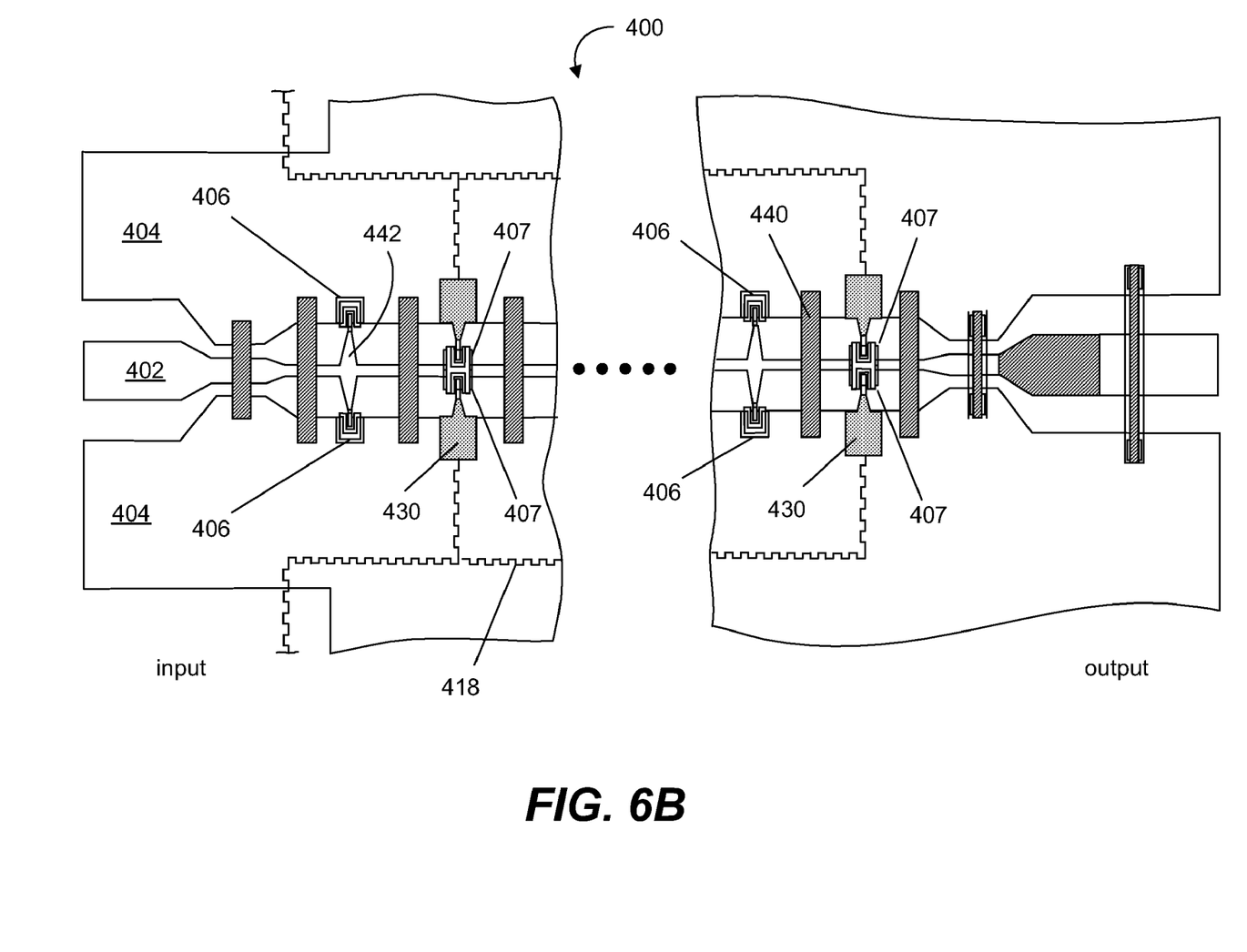
FIG. 6B is an expanded view of the input and output of the co-planar-waveguide chip layout of FIG. 6A.
Figure 7:
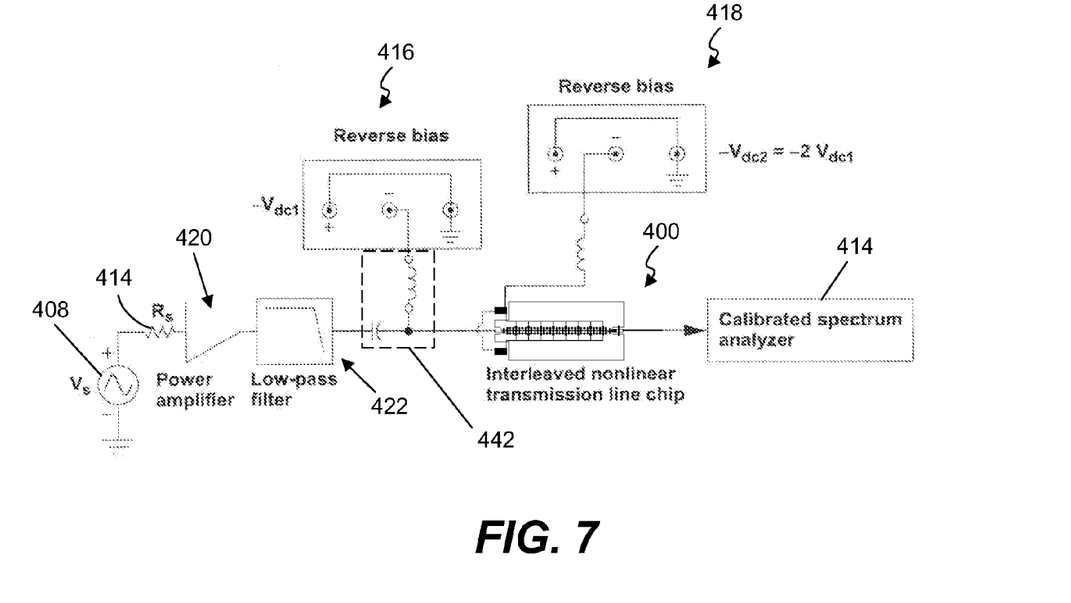
FIG. 7 is an embodiment of a test setup for measuring an output signal of an interleaved co-planar-waveguide type of non-linear transmission line in accordance with the present invention.
Figure 8A:
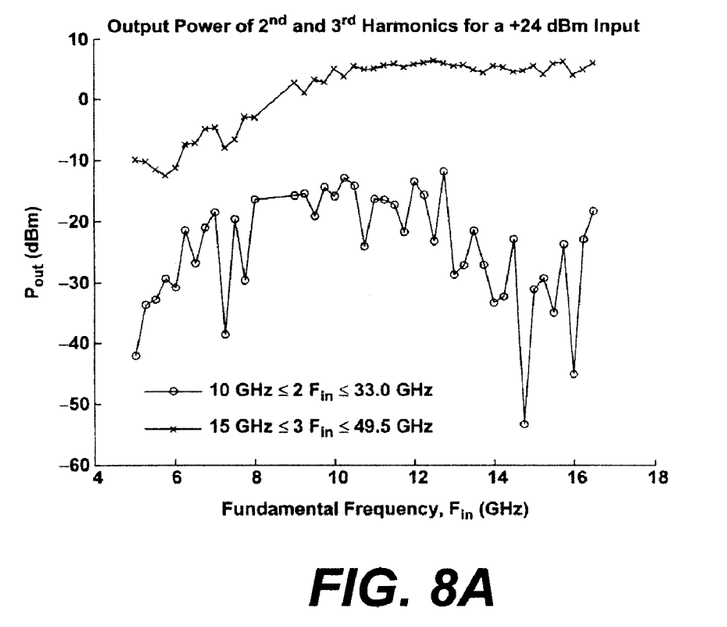
FIG. 8A is a plot of output power of second and third harmonics for a +24 dBm input signal measured using the test setup of FIG. 7.
Figure 8B:
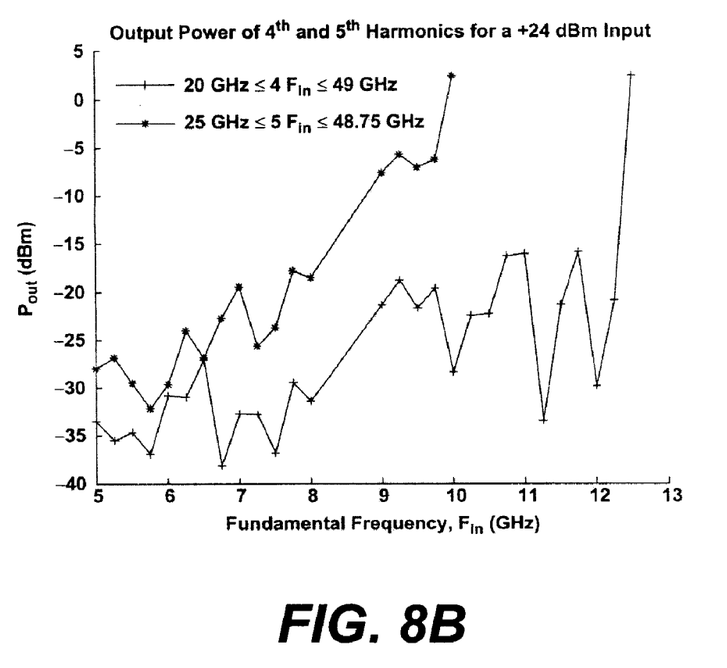
FIG. 8B is a plot of output power of fourth and fifth harmonics for a +24 dBm input signal measured using the test setup of FIG. 7.
Figure 9A:
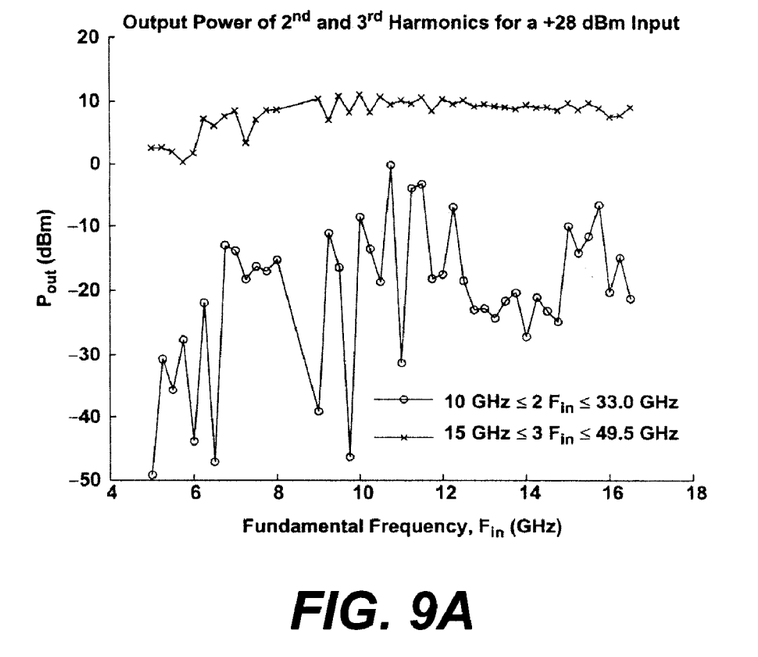
FIG. 9A is a plot of output power of second and third harmonics for a +28 dBm input signal measured using the test setup of FIG. 7.
Figure 9B:
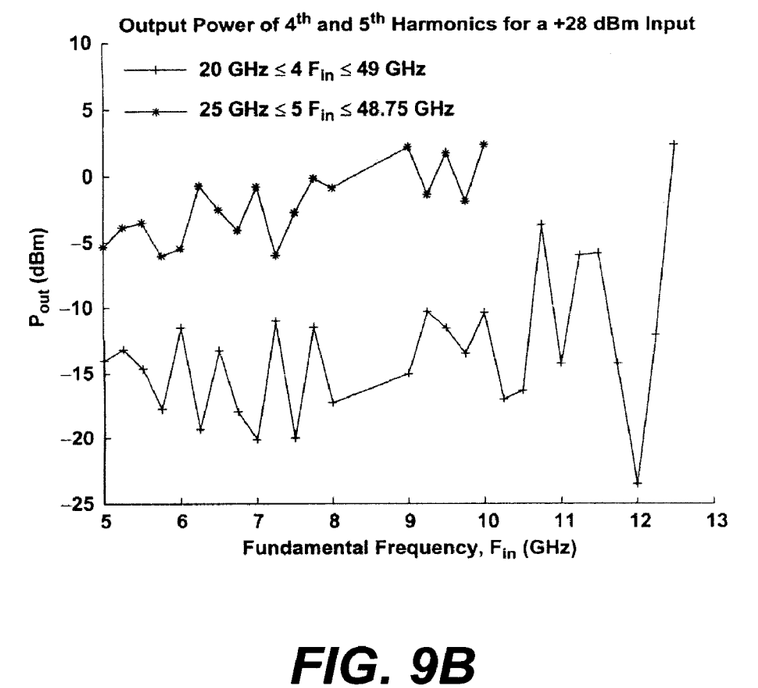
FIG. 9B is a plot of output power of fourth and fifth harmonics for a +28 dBm input signal measured using the test setup of FIG. 7.
Figure 10:
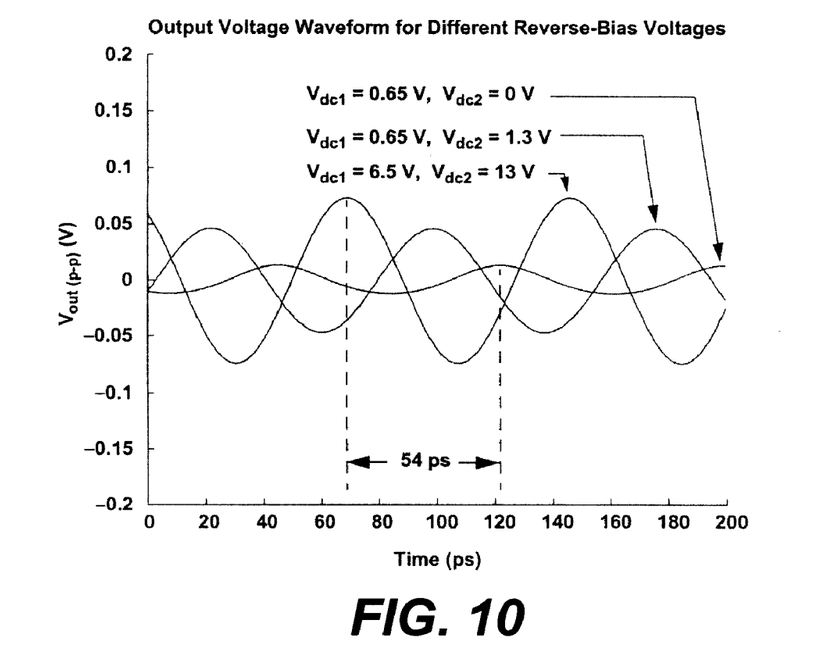
FIG. 10 is a plot of output voltage waveforms for different reverse-bias voltages measured using a sampling oscilloscope.
Figure 11A:
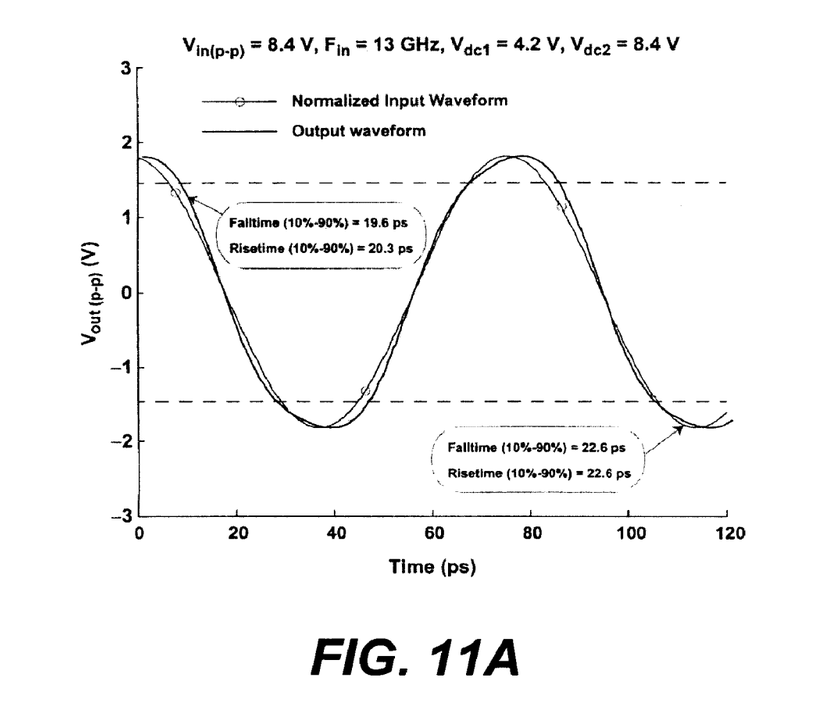
FIG. 11A is a plot of output voltage and a first normalized input waveform measured using a sampling oscilloscope.
Figure 11B:
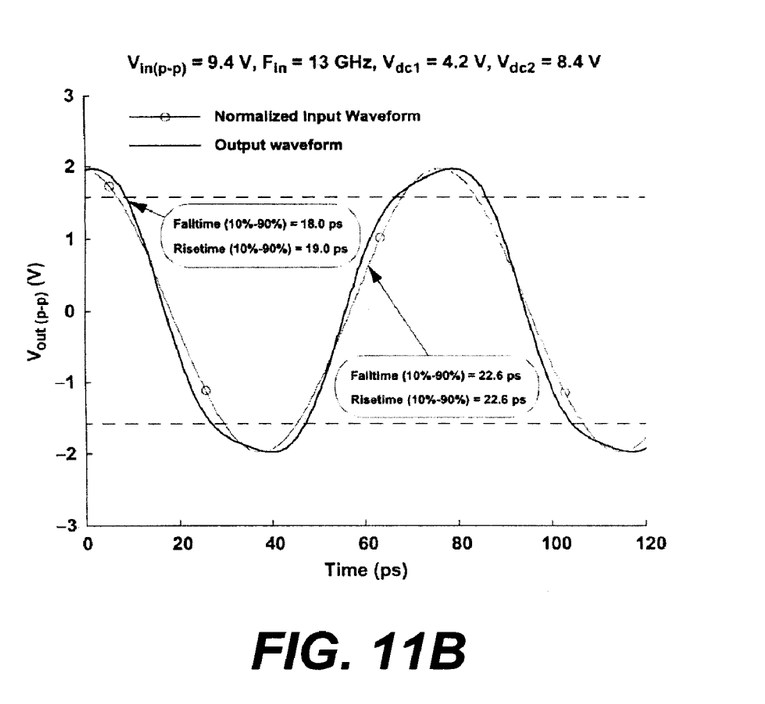
FIG. 11B is a plot of output voltage and a second normalized input waveform measured using a sampling oscilloscope.
Figure 11C:
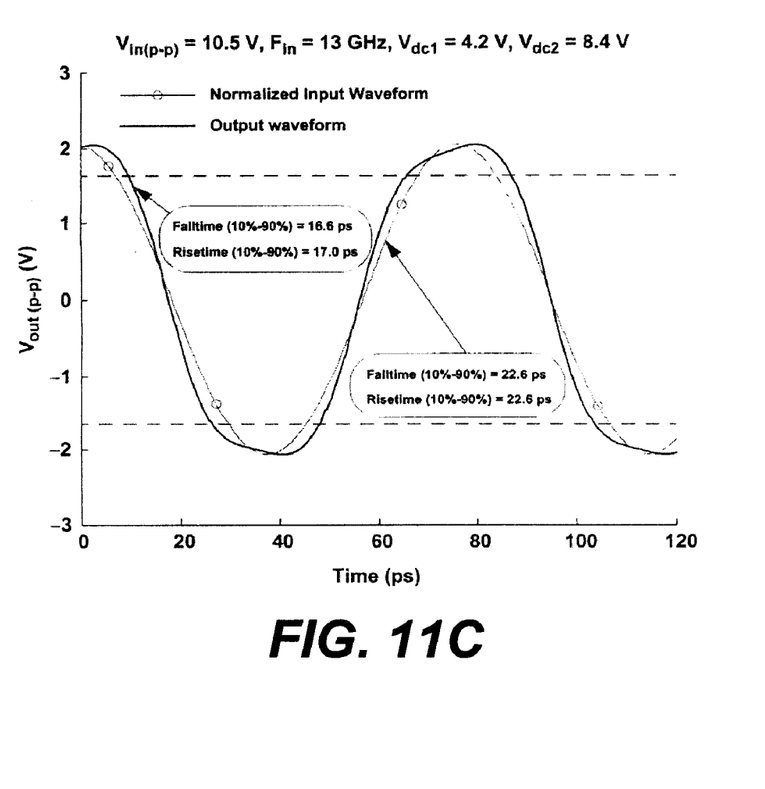
FIG. 11C is a plot of output voltage and a third normalized input waveform measured using a sampling oscilloscope.

An embodiment of a commensurate non-linear co-planar waveguide 400 employing the arrangement described above is illustrated in FIGS. 6A and 6B, and includes a sixteen-section GaAs co-planar-waveguide chip layout of the interleaved circuit in which each section is made up of two hyperabrupt Schottky varactor diodes 406,407 for a total of 32 varactors. The rise-time compression varactor diodes 407 are electrically connected with a reverse DC bias through a capacitor 430 by way of a pair of very-high-impedance traces 418. As shown, the traces 418 have a step geometry and a desired inductance. The traces 418 are isolated from the ground traces by an insulating under-layer, or some other barrier layer. DC bias for fall-time compression varactor diodes 406 is applied between the center conductor trace 402 and the ground trace 404 by way of a bias tee 442 (as shown in FIG. 7). The ground traces are connected by a plurality of bridges 440 spanning the center conductor 402. While the waveguide is shown having two ground traces and a center conductor trace between the ground traces, the structure is defined as such to comport with current standards for design of co-planar-waveguides. In other embodiments, the waveguide can have some other chip layout. For example, in an embodiment, the waveguide can have a single ground trace.

Conductor loss for a coplanar waveguide transmission line can be reduced by elevating the center conductor 402 above the substrate surface as taught in U. Bhattacharya et al., IEEE Microwave and Guided Wave Letters, vol. 5, No. 2, February 1995, pp. 50-52. Further, shock-wave coupling to surface-wave modes is reduced by elevating the center conductor 402 or all conductors 402,404 above the substrate surface as taught in U.S. Pat. No. 6,894,581. The elevated center conductor 402 is supported by means of conducting posts, or may be backed by a low-loss dielectric such as polyimide, BCB (benzo-cyclo-butene), or silicon nitride. Reduced coupling is further achieved by selecting properly the thickness of the semiconductor substrate. The reduced coupling enhances the high-frequency performance of nonlinear-transmission-line-based circuits. High-frequency harmonics can be generated in an efficient way by reducing the effect of conductor loss and loss to surface-wave modes.

FIG. 7 illustrates an experimental setup for measuring an output signal of an embodiment of an interleaved non-linear transmission line such as that shown in FIG. 6. As shown, a calibrated spectrum analyzer 414 is connected as a load to the non-linear waveguide 400 having rise compression (not shown) provided with a reverse bias from a first DC power supply 418 and fall compression varactor diodes provided with a reverse bias from a second DC power supply 416. As shown, a signal from a signal generator 408 has source impedance represented by a resistor 414. The input signal is amplified by a power amplifier 420 and passed through a low-pass filter 422 before being sent to the non-linear waveguide 400. An experimental setup as shown in FIG. 7 and another based on a sampling oscilloscope were employed to measure an ability of the interleaved non-linear waveguide 400 to perform one or more of converting a sinusoidal signal into a clock signal or equivalently into odd harmonics, enhancing simultaneously the rise and fall times of a clock or data signal, and varying simultaneously the rise and fall times of a signal by varying the signal's amplitude.

FIGS. 8A-11C are plots communicating measurements of an output signal given an input signal indicated on the plot provided to the test set-up of FIG. 7.

The foregoing descriptions of the present invention have been presented for purposes of illustration and description. They are not intended to be exhaustive or to limit the invention to the precise forms disclosed. Many modifications and variations will be apparent to practitioners skilled in this art. The embodiments were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A non-linear waveguide, comprising:
a transmission line including a first conductive line and a second conductive line;
a first bias voltage supply connected with the transmission line; and
one or more pairs of diodes connected between the first conductive line and the second conductive line, the one or more pairs of diodes including:
a first diode having an anode connected with the first conductive line and a cathode connected with the second conductive line,
a second diode having a cathode connected with the first conductive line and an anode connected with the second conductive line, and
a second bias voltage supply connected between the anode of the second diode and the second conductive line; and
a signal generator connected to the transmission line to transmit an input voltage signal that varies with time;
wherein the one or more pairs of diodes shortens a rise time and a fall time of the input voltage signal as the input voltage signal is transmitted through the transmission line to generate an output pulse signal.

2. The non-linear waveguide of claim 1, wherein:
the first bias voltage supply provides a first DC bias voltage to the input signal; and
the second bias voltage supply provides a second DC bias voltage.

3. The non-linear waveguide of claim 1, wherein the input voltage signal is substantially sinusoidal.

4. The non-linear waveguide of claim 1, wherein the first diode is a first varactor diode and the second diode is a second varactor.

5. The non-linear waveguide of claim 1, wherein the first diode is a first Schottky diode and the second diode is a second Schottky diode.

6. The non-linear waveguide of claim 1, wherein the first diode is a p-n junction device and the second diode is a p-n junction device.

7. The non-linear waveguide of claim 1, wherein:
the transmission line includes a first end and a second end;
the signal generator is connected with the first end; and
further comprising a load impedance coupled between the first conductive line and the second conductive line at the second end.

8. The non-linear waveguide of claim 1, wherein the transmission line is formed in gallium arsenide.

9. A method of shortening a rise time and a fall time of a time-varying input voltage signal as the input voltage signal is transmitted through a transmission line having a first conductive line and a second conductive line, the method comprising:
employing one or more pairs of diodes connected between the first conductive line and the second conductive line, the one or more pairs of diodes including a first diode having an anode connected with the first conductive line and a cathode connected with the second conductive line and a second diode having a cathode connected with the first conductive line and an anode connected with the second conductive line;
applying a first bias voltage to the transmission line; and
applying a second bias voltage between the anode of the second diode and the second conductive line;
wherein the step of applying the first bias voltage includes applying a reverse bias voltage; and
wherein the step of applying the second bias voltage includes applying a reverse bias voltage of substantially twice the first bias voltage.

10. A non-linear waveguide to transmit an input voltage signal that varies with time, comprising:
a transmission line;
a first direct current (DC) path connected with the transmission line for applying a first bias to compress a fall time of the input voltage signal applied to the transmission line;
at least one first diode to control the first DC path;
a second direct current (DC) path connected with the transmission line for applying a second bias to compress a rise time of the input voltage signal applied to the transmission line; and at least one second diode to control the second DC path, the at least one second diode oppositely oriented from the at least one first diode so that the second bias across the at least one second diode is opposite the first bias across the at least one first diode.

11. The non-linear waveguide of claim 10, wherein the at least one first diode is a plurality of first diodes; and the at least one second diode is a plurality of second diodes; and the oppositely oriented pluralities of first and second diodes alternate orientation in pairs so that a first diode of the plurality of first diodes controlling the first DC path is adjacent to at least one oppositely oriented second diode of the plurality of second diodes controlling the second DC path.

12. The non-linear waveguide of claim 11, wherein the oppositely oriented diodes pluralities of first and second are spaced by transmission line segments of approximately equal line lengths.

13. The non-linear waveguide of claim 12 wherein an amount of compression of the fall time and the rise time is dependent on one or more of an amplitude of the input signal, a number of diodes from the plurality of first diodes and the plurality of second diodes connected with a respective DC path, spacing between the diodes from the plurality of first diodes and the plurality of second diodes, and a magnitude of the DC voltage applied to the respective DC path.

14. The non-linear waveguide of claim 10, further comprising a capacitor connected in series with the at least one second diode.

15. The non-linear waveguide of claim 10, wherein the transmission line includes a first conductor and a second conductor; and further comprising a signal generator connected with a first end of the transmission line and a load impedance coupled between the first conductor and the second conductor at a second end of the transmission line.

16. The non-linear waveguide of claim 10, wherein the at least one first diode and the at least one second diode diodes are varactor diodes.

17. A non-linear waveguide, comprising:

a transmission line including a first conductor and a second conductor;

at least one pair of anti-parallel first and second diodes arranged between the first conductor and the second conductor;

a first bias voltage supply connected with the nonlinear waveguide so that the first diode of the at least one pair of anti-parallel first and second diodes is arranged between the first bias voltage supply and the second conductor;

wherein the first bias voltage enables compression of a fall time of the signal applied to the transmission line; and a second bias voltage supply connected with the nonlinear waveguide so that the second diode of the at least one pair of anti-parallel first and second diodes is arranged between the second bias voltage supply and the first conductor;

wherein the second bias voltage enables compression of a rise time of a signal applied to the transmission line.

18. The non-linear waveguide of claim 17, wherein the at least one pair of anti-parallel first and second diodes are varactor diodes.

* * * * *